United States Patent [19]

McCartney et al.

[11] Patent Number: 5,159,341
[45] Date of Patent: Oct. 27, 1992

[54] TWO PHASE SAMPLING FOR A DELTA SIGMA MODULATOR

[75] Inventors: Damien McCartney; David R. Welland, both of Raheen, Ireland

[73] Assignee: Analog Devices, Inc., Norwood, Mass.

[21] Appl. No.: 667,818

[22] Filed: Mar. 12, 1991

[51] Int. Cl.[5] .......................................... H03M 3/00
[52] U.S. Cl. .................................. 341/143; 341/172; 341/122
[58] Field of Search ...................... 341/143, 166, 172; 375/27, 28

[56] References Cited

U.S. PATENT DOCUMENTS

| | | | |
|---|---|---|---|
| 4,378,538 | 3/1983 | Gignoux | 333/173 |
| 4,429,285 | 1/1984 | Bradshaw | 330/279 |
| 4,439,756 | 3/1984 | Shenoi et al. | 341/143 |
| 4,588,981 | 5/1986 | Senn | 341/143 |
| 4,851,841 | 7/1989 | Sooch | 341/143 |
| 4,888,587 | 12/1989 | Kuraishi | 341/122 |
| 4,896,156 | 1/1990 | Garverick | 341/143 |
| 4,939,516 | 7/1990 | Early | 341/143 |
| 5,030,954 | 7/1991 | Ribner | 341/172 |

FOREIGN PATENT DOCUMENTS 63-153907 6/1988 Japan .

OTHER PUBLICATIONS

Choi et al., "Considerations for High-Frequency Switched-Capacitor Ladder Filters," *IEEE trans on Circuits and Systems*, CAS-27, 6 (Jun. 1980) 545-552.

Hurst et al., "Double Sampling in Switched-Capacitor Delta Sigma A/D Converters," *Proc. of IEEE Int'l Sym on Circuits and Systems*, (1990).

Caves et al., "Sampled Analog Filtering Using Switched Capacitors as Resistor Equivalents", *IEEE Journal of Solid State Circuits*, vol-SC12, No. 6, pp. 592-599, Dec. 1977.

Hosticka et al., "MOS Sampled Data Recursive Filters Using Switched Capacitor Integrators", *IEEE Journal of Solid State Circuits*, vol-SC12, No. 6, pp. 600-608, Dec. 1977.

*Primary Examiner*—Marc Hoff
*Attorney, Agent, or Firm*—Wolf, Greenfield & Sacks

[57] ABSTRACT

A delta sigma modulator provides dual phase sampling of analog input and/or a reference voltage. This dual phase sampling may be realized using a switched capacitor circuit having dual legs with a capacitor on each such leg. The dual phase sampling of the reference voltage poses a complication that mandates the necessity of providing a compensation signal. The delta sigma modulator is provided with appropriate circuitry to provide a compensation signal that compensates for the reduced signal level due to the dual sampling. In particular, the delta sigma modulator compensates for the reduced level of the output from an integrating amplifier circuit due to the timing necessary to implement the dual sampling approach.

14 Claims, 4 Drawing Sheets

TWO PHASE SAMPLING FOR A DELTA SIGMA MODULATOR

RELATED APPLICATIONS

This application concerns subject matter contained in co-pending application "Delta Sigma Modulator Having Programmable Gain/Attenuation" by Damien McCartney and David R. Welland filed on even date herewith. The co-pending application is explicitly incorporated by reference herein.

FIELD OF THE INVENTION

The present invention relates generally to analog to digital converters and, more particularly, to delta sigma modulators.

BACKGROUND OF THE INVENTION

Delta sigma modulators provide analog to digital (A/D) conversion with high resolution. Such modulators (also known as sigma delta modulators) provide A/D conversion by employing a combination of oversampling techniques and noise shaping techniques U.S. Pat. No. 4,588,981, entitled "Double Integration, Delta Sigma, Analog Digital Coder", issued on May 13, 1986 to Senn, provides a detailed discussion of one such delta sigma modulator. The delta sigma modulator described in that patent is depicted in FIG. 1.

The delta sigma modulator 10 of FIG. 1 includes an input 12 to which an analog input E(P) is applied. Typically, the analog input E(P) has a frequency ranging from DC to several kilohertz. The delta sigma modulator 10 is provided with an inverting switched capacitor circuit 67 (i.e., switches 28, 30, 32, 34 and capacitor C3) that oversamples the analog input, typically at a rate ranging from several kilohertz to several megahertz.

The delta sigma modulator 10 also includes a first integrator 18 formed from an amplifier 19 and an integration capacitor C5. The non inverting input of the amplifier 19 is tied to ground, whereas the inverting input is coupled to inverting switched capacitor circuit 67 and to an additional inverting switched capacitor circuit 63. The additional inverting switched capacitor circuit 63 includes switches 36 38, 40 and 42 and a capacitor C1. This additional inverting switched capacitor circuit 63 samples the output signal S(P) of the modulator 10 and feeds back corresponding charge packets to the integration capacitor C5. The central role of circuit 63 is as a feedback mechanism that helps to stabilize the modulator 10.

The first integrator 18 produces an output corresponding to the amount of charge dumped from capacitors C3 of circuit 67 and C1 of circuit 63 onto the integration capacitor C5. The delta sigma modulator 10 also includes a second integrator 20 comprised of a second operational amplifier 64 and a second integration capacitor C8. Inverting switched capacitor circuit 61 forwards a signal to the inverting input of the amplifier 64. The mean amplitude of this signal is proportional to the amplitude of the output signal S(P). Inverting switched capacitor circuit 61 comprises switches 15, 17, 19 and 21 and capacitor C4. The non-inverting input of the amplifier 64 is tied to ground.

The second integrator 20 is preferably used in conjunction with switched capacitor circuit 61 and a switched capacitor circuit 93 as a filter that cooperates with the first integrator 18 to shape the noise at the output of the modulator, to facilitate later digital filtering of the output. The switched capacitor circuit 93 includes switches 52, 54, 60 and 62 and capacitor C2. This switched capacitor circuit 93 passes a signal from the output of the first integrator 18 onto the inverting input of the amplifier 64.

The output of the second integrator 20 is connected to the D input of a quantization circuit, realized in FIG. 1 as a D type flip flop 73. The reference voltages $+V_{ref}$ and $-V_{ref}$ are applied to the D flip-flop 73 and constitute the possible values of the S(P) output signal. The clock input Ck of the flip-flop 73 receives a timing signal H2, provided by a timing circuit 69 which determines S(P) (i.e., $+V_{ref}$ or $-V_{ref}$). The digital output signal S(P) is produced from the inverted output Q* of flip flop 73.

The operation of delta sigma modulator 10 will be explained with reference to FIG. 2. Initially, at time $T_1$, timing circuit 69 sets control signal $H_1$ high. For the present discussion, when a control signal is high, the switch receiving the control signal is closed, and when the control signal is low, the switch is open. Hence, in circuit 67, switches 28 and 34 close in response to the high level of control signal $H_1$. Switches 30 and 32, on the other hand, are responsive to control signal $H_2$, which is set low by timing circuit 69 at time $T_1$; accordingly, switches 30 and 32 are open. This switch configuration causes the capacitor C3 to be charged to the level of the voltage of the analog input. At time $T_2$ switches 28 and 34 are opened by timing circuit 69 setting control signal $H_1$ low, while switches 30 and 32 are closed by timing circuit 69 setting control signal $H_2$ high. This switch configuration causes the voltage across capacitor C3 to be impressed on the summing node VN1.

The control signals $H_1$ and $H_2$ issued by the timing circuit 69 also control the switches in circuit 63. For the circuit 63, switches 36 and 42 are controlled by the control signal $H_1$, whereas switches 38 and 40 are controlled by the control signal $H_2$. Hence, at time $T_1$, capacitor Cl begins charging and at time $T_2$, capacitor $C_1$ begins discharging. Thus, these control signals control the timing of the switches in these circuits 63 and 67 so that capacitor C3 and capacitor Cl charge and discharge together. It is, thus, apparent that, for each clock cycle, sampling of the input and the feedback occurs during the phase when $H_1$ is high and dumping of the sampled packets of charge occurs during the phase when $H_2$ is high. This scheme provides a time frame equal to the time when $H_1$ is high for the capacitors Cl and C3 to charge to the appropriate level.

Since both circuits 63 and 67 dump packets of charge onto the integration capacitor C5, the output produced from the first integrator 18 is indicative of the net charge that these circuits dump onto capacitor C5. In particular, since the non-inverting input of the amplifier 19 is tied to ground, this configuration provides an output signal that is proportional to the integral of the voltage at the input of the integrator 18. Accordingly, the output will reflect the cumulative effect of the charge packets of the sampled analog input and the charge packets fed back into the first integrator 18 from switched capacitor circuit 63.

Output from the integrator 18 is sampled by inverting switched capacitor circuit 93. The timing of the operation of the inverting switched capacitor circuit 93 is synchronized with the timing of the operation of the circuit 61. Specifically, at time $T_1$ (see FIG. 2), switches 52 and 60 are open (because control signal $H_2$ is low)

while switches 54 and 62 are closed (because control signal H₁ qoes high). This switch configuration causes the discharging of the capacitor C2. At time T₂, however, switches 52 and 60 are closed by control signal H₂ going high, whereas switches 54 and 62 are opened by asserting control signal H₁ low. In this switch configuration, capacitor C2 charges.

The output from inverting switched capacitor circuit 93 is supplied to the inverting input of amplifier 64 of the second integrator 20. Also connected to this inverting input is the output from inverting switched capacitor circuit 61 at a second summing node VN2. This circuit 61 comprises switches 15, 17, 19 and 21 and capacitor C4. Its control timing signals are synchronized with timing signals of input sampling circuit 93. Capacitor C2 and capacitor C4 begin charging at time T₂ and begin discharging at time T₄ when H₁ qoes high again. The output produced from the circuit 61 has a mean amplitude that is proportional to the mean amplitude of the output S(P).

The second integrator 20 receives the charges from circuits 6 and 93. It produces an output indicative of the amount of charge that is passed to it. The resulting output signal is passed to the D type flip flop 73 wherein the output signal is quantized to produce the signal S(P).

The capacitances of capacitors Cl and C3 dictate the size of the switches employed in the circuits 63 and 67, respectively. Specifically, the switches must be large enough to handle the amount of charge that is accumulated and discharged on the capacitors. Since the capacitances of capacitors Cl and C3 dictate the amount of charge dumped to the integrator 18, these capacitances also affect the current drive requirements of the amplifier that is employed.

It is, therefore, an object of the present invention to decrease the capacitances of the capacitors used to sample the analog input.

It is another object of the present invention to decrease the capacitances of the capacitors used to sample the reference voltage.

It is yet another object of the present invention to decrease current drive requirements of the amplifier of the first integrator.

It is a final object of the present invention to decrease the size of switches employed within the switched capacitor circuits that sample the analog input and reference voltage.

SUMMARY OF THE INVENTION

The foregoing objects are realized by a delta sigma modulator that converts an analog input into a digital output. The delta sigma modulator includes a means for sampling the analog input. This means may include first and second means for alternately sampling the analog input t produce charge packets of analog input. The delta sigma modulator also includes a sampling means for sampling a reference voltage to produce charge packets of reference voltage. Preferably, this means for sampling the reference voltage, likewise, has two legs for alternately sampling the reference voltage. A switched capacitor circuit having a capacitor in each leg is one implementation of these sampling circuits. The capacitances of the capacitor on the first leg may, but need not, be substantially equal to the capacitance of the capacitor on the second leg.

The delta sigma modulator further includes an integrating amplifier circuit that receives analog input charge packets and reference charge packets from the respective sampling means to produce an output indicative of the amount of charge received. Lastly, the delta sigma modulator is provided with a converter for converting the output from the integrating amplifier into digital form to produce the digital output.

According to one embodiment, the delta sigma modulator additionally includes a first sampling means that samples output from the first integrating amplifier circuit and a second integrating amplifier circuit for receiving charge packets from said first sampling means. In addition, a second sampling means is provided to sample the output of the first integrating amplifier circuit. Further, a compensating means is provided for generating a compensation output that compensates for a reduced level of output from the first integrating amplifier circuit when the output of the first integrating amplifier circuit is sampled by the second sampling means. The delta sigma modulator may also include a digitizing means for receiving compensation output for the means from compensating, output from the second integrating amplifier circuit and output from the first integrator to produce a digital output indicative of the level of these three received inputs.

BRIEF DESCRIPTION OF THE DRAWING

The above invention will be more fully described with reference to the accompanying figures.

DETAILED DESCRIPTION

Figure 1:
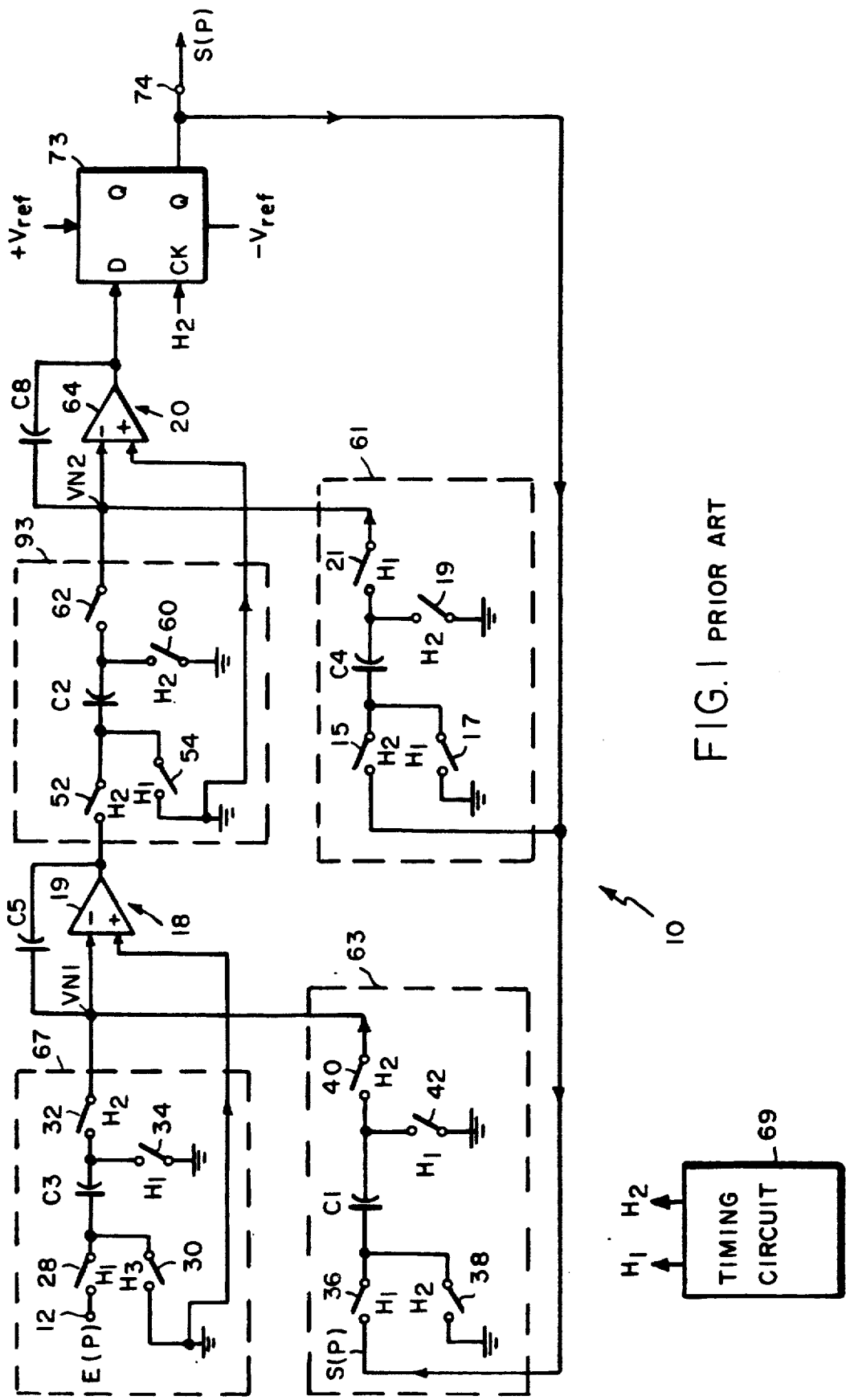
FIG. 1 is a schematic diagram of a conventional prior art delta sigma modulator.
Figure 2:
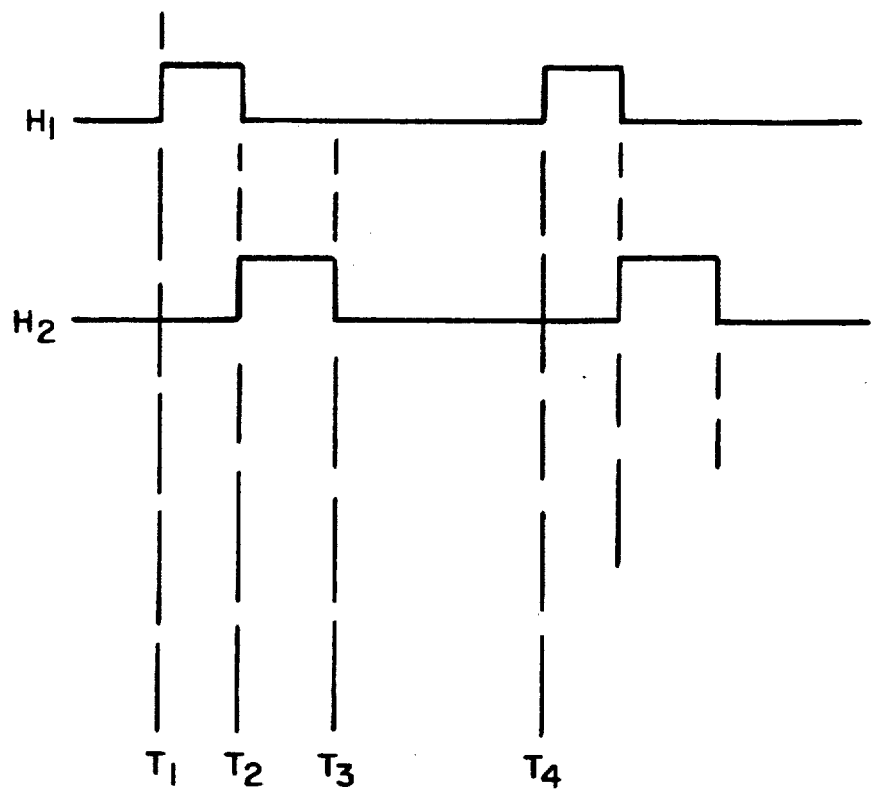
FIG. 2 is a set of timing diagrams for the control signals of the delta sigma modulator of FIG. 1.
Figure 3:
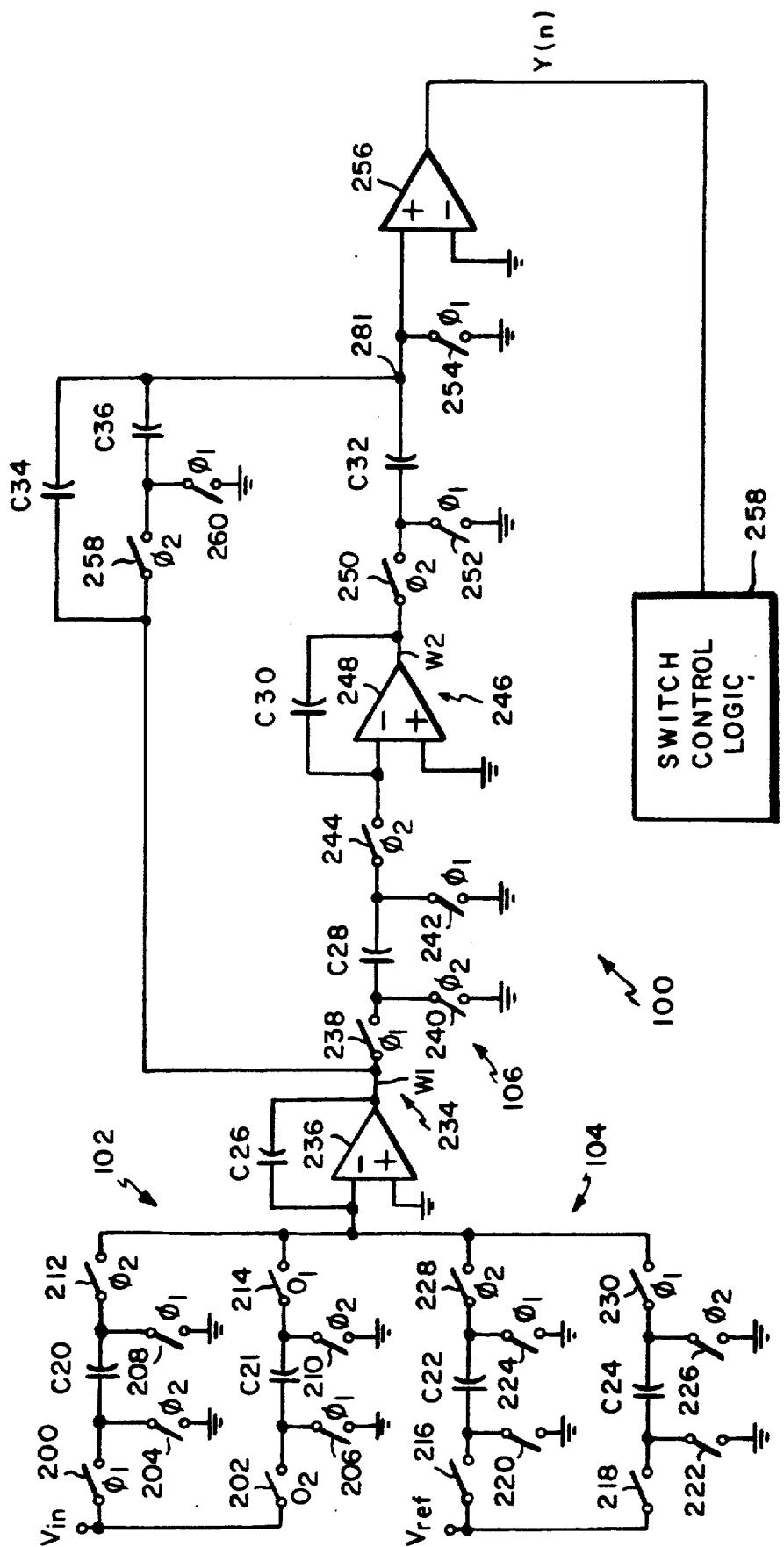
FIG. 3 is a schematic diagram of a delta sigma modulator with two phase sampling.

An embodiment of a delta sigma modulator 190 of the present invention is depicted in FIG. 3. In accordance with this embodiment, a dual leg switched capacitor circuit is used to sample the analog input $V_{in}$. This approach allows capacitors C20 and C21 to have capacitances that ar one half that of capacitor C3 of the prior art embodiment of FIG. 1. In addition, by employing these dual capacitors, the current drive requirements of the integrating amplifier 236 are reduced because smaller packets of charge are passed to the integration capacitor C26 from the lower capacitance capacitors C20 and C21. Still further, the switches may be made smaller because of the reduced amount of charge that is transferred through them. Smaller switches occupy less area on a chip, and cause less charge injection onto the capacitors The delta sigma modulator 100 of FIG. 3 is provided with a circuit 102 for sampling the analog input $V_{in}$. This circuit 102 is comprised of upper and lower legs for alternately sampling this analog input $V_{in}$. The upper leg comprises switches 200, 204, 208 and 212 and a sampling capacitor C20. The lower leg has a similar construction and includes switches 202, 206, 210 and 214 and capacitor C21.

In this modulator 100, the reference voltage $V_{ref}$ may also be sampled by a dual leg switched capacitor circuit 104 such as shown in FIG. 3. This circuit 104 has an upper leg comprising switches 216, 220, 224 and 228 and capacitor C22. Likewise, it has a lower leg comprising of switches 218, 222, 228 and 230 and capacitor C24.

The charges dumped from capacitors C20, C21, C22 and C24 are forwarded to a first integrator 234. The charge is accumulated on an integration capacitor C26 and an output is produced from the first integrator 234 indicative of the amount of charge accumulated on the integration capacitor C26.

Following the first integrator 234 is a circuit 106 comprising switches 238, 240, 242 and 244 and capacitor C28. This circuit 106 serves to sample the output from the first integrator 234. The samples of first integrator output are then passed to a second integrator 246. The second integrator 246 includes an amplifier 248 and integration capacitor C30. Output of the second integrator 246 is sampled by the circuit that includes switches 250 and 252 and capacitor C32.

The output from the first integrator 234 also passes to capacitor C34 and to the circuit including switches 258, 260 and capacitor C36. The function of these additional elements will be described in more detail below.

A summing node 281 is situated at the junction between the capacitors C32, C34 and C36. The voltage developed at this summing junction is compared to a reference voltage (shown as ground in FIG.. 3) by a comparator 256. A resulting output is fed to switched control logic unit 258 that generates signals to control the switches of the delta sigma modulator. A switch 254 is provided to connect the non inverting input of the comparator 256 to ground.

The comparator 256 generates a output indicative of the voltage V at the summing junction 281. The comparator 256 compares this voltage to a reference voltage (shown as a ground in FIG. 3), tied to its inverting input, to generate an appropriate output. If the comparison indicates that the voltage at the summing junction is greater than the reference voltage, a "1" output is generated. The "1" output causes the switch control logic 258 to generate negative charge packets. On the other hand, if comparison reveals that the voltage at the summing junction is less than the reference voltage, a "0" output is issued, and positive charge packets are generated by the switch control logic 258. It should further be appreciated that when $\phi_1$ switch 254 is closed to connect to ground, no voltage can be developed at the summing junction. Operation of the modulator 100 will now be described with reference to FIGS. 3 and 4. The legs of the sampling circuits 102 and 104 for sampling $V_{in}$ and $V_{ref}$, respectively, operate in alternating fashion so that as the capacitor in one leg is being charged, the capacitor in the other leg is being discharged. For instance, as shown in the timing diagram provided in FIG. 4, at time $T_1$, the timing signal $\phi_1$ is high and the timing signal $\phi_2$ is low so that switches 200 and 208 of the circuit for sampling $V_{in}$ are closed while switches 204 and 212 are open. When the circuit has this switch configuration, capacitor C20 charges to the level of the analog input $V_{in}$. In contrast, in the lower leg of this circuit, switches 206 and 214 are closed (because $\phi_1$ is high) while switches 202 and 210 are opened because $\phi_2$ is low). This switch configuration causes the capacitor $\phi_2$ to discharge to the first integrator 234.

At time $T_2$, the upper and lower legs switch roles. In particular, in the upper leg, switches 204 and 212 are closed (because $\phi_2$ high), and switches 200 and 208 are open (because $\phi_1$ is low) so that capacitor C20 begins discharging to the first integrator 234. On the other hand, in the lower leg, switches 202 and 210 are closed (because $\phi_2$ is high) and switches 206 and 214 are opened (because $\phi_1$ is low) so that capacitor C21 charges to the level of the analog input $V_{in}$.

It should be appreciated that the timing is shown for the case wherein the switches open at the same time. Nevertheless, to limit the extent of charge injection error, a slight time delay between the opening of the consecutive switches may be used. The slight delay between the opening of consecutive switches helps to eliminate charge injection error. More particularly, the delay ensures that any resulting error is substantially independent of the analog input level so that error compensation can be applied.

The circuit that samples $V_{ref}$ also may have two separate legs, with a capacitor on each leg as shown in FIG. 3. When this configuration is adopted, charge packets are sent from capacitor C22 and C24 in alternating fashion, as was done for the switched capacitor circuit that samples the analog input $V_{in}$. Thus, the control signals for the switches 224, 228, 226 and 230 are like their counterparts in the circuit for sampling the analog input. The timing of the operation of switches 216, 218, 220 and 222, however, does not necessarily correspond to the timing of the operation of the counterpart switches in the circuit that samples the analog input. The operation of switches 216, 218, 220 and 222 is based on whether positive or negative charge packets are desired.

If the comparator output in (n−1)th cycle is a "0", positive charge packets are added. Accordingly, during the first phase of the nth cycle, capacitor C22 is charged to $V_{ref}$ by closing switch 216 while leaving switch 220 open. This charge is transferred to the integration capacitor C26 in the second phase of the nth cycle by closing switch 220 while switch 216 is open. During the same phase, capacitor C24 charges to $V_{ref}$ by having 218 closed and 222 open. This charge is transferred to integration capacitor C26 by closing switch 222 and opening switch 218 in the first phase of the (n+1)th cycle. Accordingly, the output of the first integrator is not at its desired value until the end of the first phase.

If the comparator decision (i.e., output) in (n−1)th cycle is a "1", the modulator adds negative charge packets. This is achieved by reversing the roles of switches 216 and 220 and switches 218 and 222 in the above description.

A complication arises with the dual leg sampling of the reference voltage due to synchronization difficulties relating to the sampling by capacitor C36 relative to the output of the first integrator 234. A plot of the output W1 of the first integrator is shown as a solid line 235 in FIG. 4. For the instance where a single capacitor is utilized to sample $V_{ref}$ and a single capacitor is used to sample $V_{in}$, W1 only changes value at the beginning of the second phase for any given clock cycle. Hence, for such a embodiment, capacitor C36 samples the output in the second phase of any given cycle wherein it gets the correct value of W1. However, when the dual capacitor approach is adopted, the output value of W1 changes in both the first phase and the second phase. Hence, the capacitor C36 gets an incorrect value.

Figure 4:
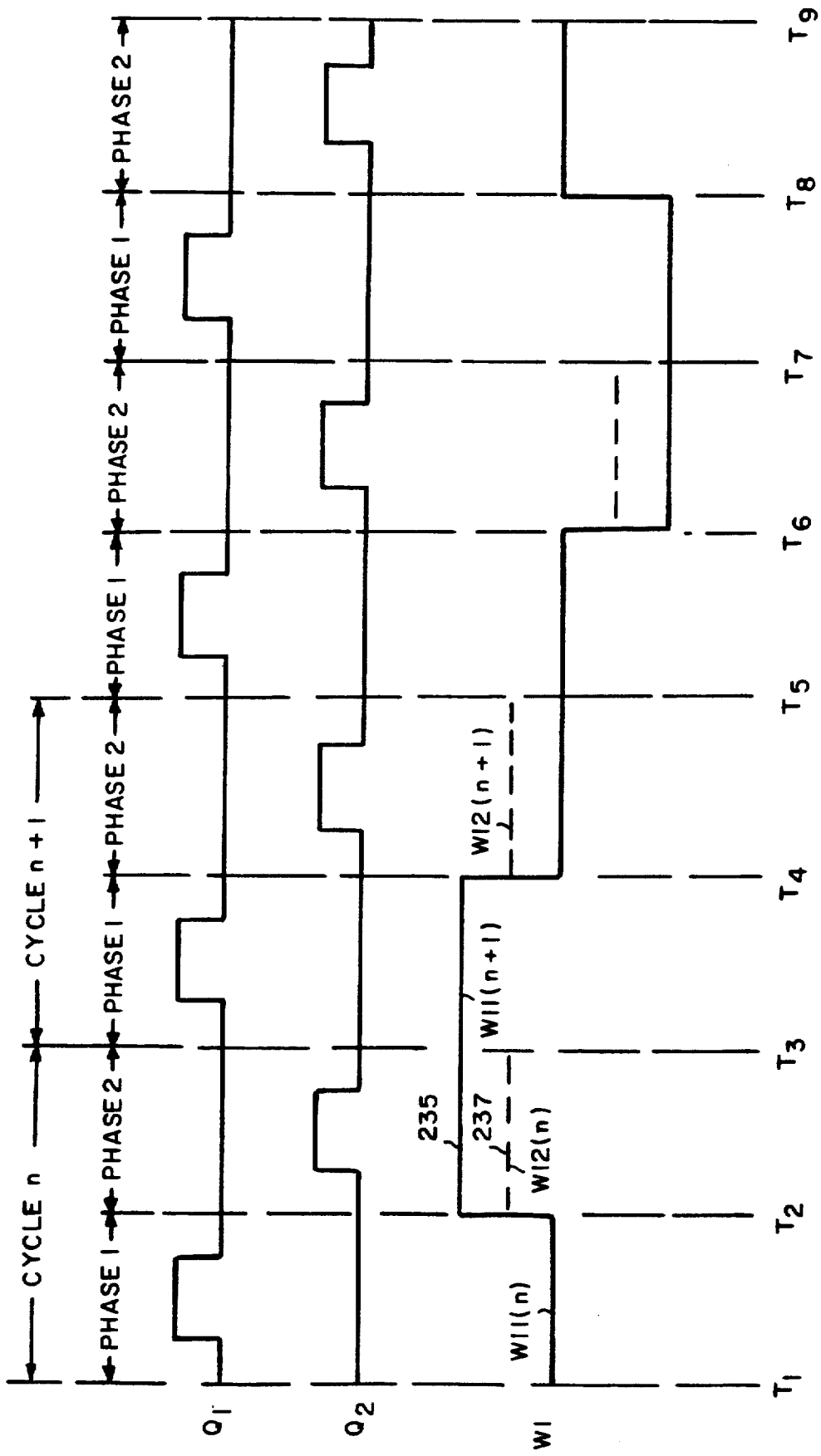
FIG. 4 is a timing diagram for the delta sigma modulator of FIG. 3.

The difficulties encountered in the dual phase sampling approach can be better seen in the plot of the output value W1 for the dual capacitor approach shown in FIG. 4 in phantom form at 237. The notation W11(n) refers to the value of W1 in the first phase of the nth clock cycle. Likewise, W12(n) refers to the value of W1 in the second phase of the nth clock cycle. During the second phase, the difference between W12(n) and W11(n) is only half the value of the corresponding difference when single phase sampling is used (shown as a solid plot 235) at the second phase of the nth cycle. As such, capacitor C36 is incorrectly charged during the second phase of the nth cycle. To compensate for this potential difficulty, a compensation signal is provided for this error by approximating what the level would be if the single capacitor approach were utilized. This compensation signal is derived from the capacitor C34.

To properly understand how the delta sigma modulator of FIG. 3 produces the compensation signal, it is necessary to first set forth the ratio of the capacitances of the capacitors that are used in the modulator. These capacitance ratios may be as follows:

$$CC20 = CC21;$$

$$CC22 = CC24 = CC20 \times (4/3);$$

$$CC26 = CC20 \times 12;$$

$$CC30 = CC28 \times 4;$$

$$CC32 = CC36 \times (CC30/CC28) \times (\tfrac{1}{4});$$

where,
CC20 = capacitance of capacitor C20;
CC21 = capacitance of capacitor C21;
CC24 = capacitance of capacitor C24;
CC26 = capacitance of capacitor C26;
CC28 = capacitance of capacitor C28;
CC30 = capacitance of capacitor C30;
CC32 = capacitance of capacitor C32;
CC34 = capacitance of capacitor C34; and
CC36 = capacitance of capacitor C36.

The leg of the modulator on which capacitor C36 is positioned serves to sum the output from the first integrator 234 with the output of the second integrator 246. If the first integrator output and the second integrator output are not summed, it is well known that the modulator will become unstable. The leg with capacitor C34, however, serves a different role. It provides a compensation signal, as will be described in more detail below. The remaining leg positioned after the first integrator (having the second integrator 246 on it) is used to generate the second integrator output.

Operation of this third leg is as follows. Initially, during phase 1 when $\phi_1$ is high, switches 238 and 242 are closed, whereas switches 240 and 244 are open. This switch configuration causes the capacitor C28 to charge to the level of the output W1 from the first integrator 234. For notational convenience, this output W1 is denoted as W11. During the second phase of the cycle, switches 238 and 242 are opened, while switches 240 and 244 are closed. This configuration of the switches causes the discharge of the capacitor C28 to the second integrator 246. The output from the second integrator is then sampled by the circuit which includes switches 250 and 252 and capacitor C32.

The operation of the other two legs can be understood by examining charge conservation in the loop. In particular, an understanding of the modulator's operation can be realized by examining the charge on the righthand side of the capacitors C34, C36 and C32. During the first phase of a clock cycle when $\phi_1$ is high, only capacitor C34 has a charge on it. Capacitor C36 has no charge on it because switch 260 is closed to connect its lefthand side to ground, whereas switch 258 is open, and the voltage on the righthand side of the capacitor is necessarily zero because switch 254 is closed. Similarly, capacitor C32 has no charge on it because switch 252 is closed to connect it to ground, whereas switch 250 is open. Hence, the charge during the first cycle $Q_1$ can be expressed as follows:

$$Q_1 = (CC34)(W11)$$

The charge on the righthand side of the capacitor C34 is at this level because the output W11 is being applied to the lefthand side of the capacitor whereas zero voltage is being applied to the righthand side. During the phase of a clock cycle when $\phi_2$ is high, the charge $Q_2$ on the righthand side of the capacitors is much different. In particular, all of the capacitors are charged to different levels. For notational convenience, to this voltage is referred to as V, as previously noted. Hence, the charge on the righthand side of capacitor C34 is dictated by the different voltages on the respective sides of the capacitor and is expressed as:

$$CC34(V - W12),$$

where CC34 is the capacitance of capacitor C34, and V and W12 are as described above. In other words, the capacitor C34 has a charge on its righthand side dictated by its capacitance and the difference between V and the output of the first integrator during the second phase.

The capacitor C36 has a charge on its righthand side during the second phase that is expressed as:

$$CC36(V - \dot{W}12),$$

where CC36 equals the capacitance of the capacitor C36, and V and W12 are as described above. The lefthand side of capacitor C36 is at W12 because switch 258 is closed and switch 260 is open. Lastly, the charge on the righthand side of capacitor C32 can be expressed as:

$$CC32(V - W2),$$

where CC32 equals the capacitance of capacitor C32 and V and W2 are as described above. The lefthand side of capacitor C32 is at W2 because switch 250 is closed and switch 252 is open.

By conservation of charge, $Q_1$ must equal $Q_2$. Therefore:

$$(CC34)(W11) = CC34(V - W12) + CC36(V12) + CC32(V - W2),$$

which can be expanded to $$-(CC34)(W11) = (CC34 + CC36 + CC32)V$$
$$(CC36)(W12) - (CC32)(W2)(CC34)(W12),$$

which yields $$V = (CC36/(CC32 + CC34 + CC36))(W12) +$$
$$(CC32/(CC32 + CC34 + CC36))(W2) +$$
$$(CC34/(cc32 + CC34 + CC36))(W12 - W11)$$
$$= (CC36/(CC32 + CC34 + CC36))$$
$$X(W12 + (CC32/CC36)(W2) + (CC34/CC36)(W12 - W11)).$$

This equation can, in turn, be simplified by exploiting the relationships between the capacitances to:

$$V = 2\ W12(n) + 2(W12(n) - W11(n)) + W2(N).$$

This equation provides a concise summary of the voltage at the summing junction 281 during the second phase of a clock cycle and confirms the above description. From this equation, it is apparent that a compensation term (W12−W11) is added by the present invention to W12 to provide an accurate estimate of what the value of W12 would have been using single phase sampling.

It should be apparent that the compensation assumes that the change in the first integrator 234 output from the second phase to the first phase is the same as what it was on the previous first phase to second phase transition. Certainly, the reference component in this charge will be equal assuming the capacitance of the capacitor C24 is substantially equal to the capacitance of capacitor C22. Also, the analog input component will be the same if the capacitance of capacitor C21 is substantially equal to the capacitance of capacitor C20 and $V_{in}$ remains substantially unchanged between phases. This assumption is valid for delta sigma converters where the modulator clocking rate (i.e. rate of the modulator clock) is much greater than the bandwidth of $V_{in}$.

While the present invention has been described with reference to a preferred embodiment thereof which is presented by way of example only, it will be apparent to those skilled in the art that various changes in form and detail may be made without departing from the spirit and scope of the invention. The examples are, thus, not intended to be limiting and the invention is defined only in the appended claims. For instance, multiple reference voltages may be used instead of a single reference voltage. Furthermore, an equivalent differential circuit having twice the number of capacitors may be used. Likewise, differential input/output operational amplifier may be used. Still further, differential $V_{in}$ or $V_{ref}$ may be used. Lastly, different order modulators or indeed different topologies of second order modulators may be used.

We claim:

1. A delta sigma modulator for converting an analog input into a digital output, comprising:
   a) first and second means for sampling the analog input at a first rate to produce analog input charge packets, said first means for sampling the analog input at a first rate and said second means for sampling the analog input at a first rate alternately producing analog input charge packets;
   b) means for sampling a predetermined reference voltage to produce reference charge packets, said means for sampling the predetermined reference voltage being distinct from the first and second means for sampling the analog input;
   c) an integrating amplifier circuit for receiving analog input charge packets from said first and second means for sampling the analog input and for receiving reference charge packets from said means for sampling the predetermined reference voltage, to produce an output, at a second rate which is approximately one half the first rate, said output indicative of the net amount of the analog input charge packets and the reference charge packets that are received; and
   d) means for converting the output from the integrating amplifier circuit at the second rate into digital form to produce the digital output of the modulator.

2. A delta sigma modulator as recited in claim 1 wherein said first and second means for sampling the analog input each include a capacitor for holding an analog input charge packet.

3. A delta sigma modulator as recited in claim 2 wherein the capacitance of the capacitor of the first means for sampling the analog input is substantially equal to the capacitance of the capacitor of the second means for sampling the analog input.

4. A delta sigma modulator as recited in claim 1 wherein said means for sampling the predetermined reference voltage comprises a first means for sampling the predetermined reference voltage to produce reference charge packets and a second means for sampling the predetermined reference voltage to produce reference charge packets in alternating fashion with said first means for sampling the predetermined reference voltage.

5. A delta sigma modulator as recited in claim 4, further comprising a compensating means for qeneratinq a compensation output that compensates for a reduced level of output from the integrating amplifier circuit due to the use of said alternating first and second means for sampling the predetermined reference voltage.

6. A delta sigma modulator as recited in claim 4 wherein said first and second means for sampling the predetermined reference voltage each include a capacitor for holding a reference charge packet.

7. A delta sigma modulator as recited in claim 6 wherein the capacitance of the capacitor of the first means for sampling the predetermined reference voltage is substantially equal to the capacitance of the capacitor of the second means for sampling the predetermined reference voltage.

8. In a delta sigma modulator, a method comprising the steps of:
   a) sampling an analog input voltage with a first means to obtain analog input samples at a first rate;
   b) sampling the analog input voltage at a first rate with a second means in alternating fashion with said first means to obtain analog input samples;
   c) sampling a predetermined reference voltage with a reference sampling means, that is distinct from the first and second means for obtaining analog input samples, to obtain reference samples; and
   d) combining the analog input samples from the first means and the second means with reference samples from the reference sampling means to produce a combined output at a second rate that is approximately one half the first rate;
   e) integrating the combined output with an integrator and forwarding said integrated combined output to a quantizer; and
   f) producing a digital output from the quantizer at the second rate, said digital output being indicative of the combined analog input samples and reference samples.

9. A method as recited in claim 8 wherein said step of sampling an input with a first means comprises charging a capacitor to the level of the analog input.

10. A method as recited in claim 8 wherein said combining step comprises forwarding said analog input samples and said reference samples to an integrator that produces an output indicative of the net amount of charge of samples.

11. A delta sigma modulator for converting an analog input into a digital output, comprising:
   a) first and second means for sampling the analog input to produce analog input charge packets, said first means for sampling the analog input and said second means for sampling the analog input alternately producing analog input charge packets;

b) means for sampling a predetermined reference voltage to produce reference charge packets, said means for sampling the predetermined reference voltage comprising a first means for sampling the predetermined reference voltage to produce reference charge packets and a second means for sampling the predetermined reference voltage to produce reference charge packets in alternating fashion with said first means for sampling the predetermined reference voltage;

c) an integrating amplifier circuit for receiving analog input charge packets from said first and second means for sampling the analog input and for receiving reference charge packets from said means for sampling the predetermined reference voltage, and for integrating all said charge packets to produce an output indicative of the net amount of the analog input charge packets and the reference charge packets that are received; and d) means for converting the output from the integrating amplifier circuit into digital form to produce the digital output of the modulator; and e) a compensating means for generating compensation output that compensates for reduced level of output from the integrating amplifier circuit due to the use of said alternating first and second means for sampling the predetermined reference voltage.

12. In a delta sigma modulator, a method comprising the steps of:

a) sampling an analog input voltage at a first rate with a means for sampling to obtain analog input samples;

b) sampling a predetermined reference voltage with a first means, which is distinct from the means for sampling the analog input, to obtain reference samples;

c) sampling the predetermined reference voltage with a second means, which is distinct from the means for sampling the analog input, in alternating fashion with said first means to obtain reference samples; and d) combining the analog input samples with the reference samples from the first and second means to produce a combined output; and e) integrating the combined output with an integrator and forwarding said integrated combined output to a quantizer; and f) producing a digital output from the quantizer at the first rate, said digital output being indicative of the combined analog input samples and reference samples.

13. A method as recited in claim 12 wherein said combining step comprises forwarding said analog input samples and said reference samples to an integrator that produces an output indicative of the net amount of charge of analog input and reference samples that are received.

14. A delta sigma modulator for converting an analog input into a digital output, comprising:

a) means for sampling the analog input to produce charge packets of analog input;

b) first and second means for alternately sampling the reference voltage to produce charge packets of a predetermined reference voltage;

c) a first integrating amplifier circuit for receiving charge packets from said means for sampling the analog input and from the first and second means for sampling the predetermined reference voltage to produce an output indicative of the net amount of charge received;

d) first and second means for sampling the output from the first inteqrating amplifier circuit to produce amplifier packets of charge;

e) a second integrating amplifier circuit for receiving charge packets from the first means for sampling output from the first integrating amplifier circuit and for producing an output indicative of the amount of charge received from said first means for sampling the first integrating amplifier output;

f) compensating means for generating a compensation output that compensates for a reduced level of output from the first integrating amplifier circuit when the output is sampled by the second means for sampling the first integrating amplifier circuit; and g) digitizing means for receiving compensation output from the means for compensating, for receiving output from the second sampling means, and for receiving output from the second integrating amplifier circuit to produce a digital output indicative of levels of said received signals.

* * * * *

UNITED STATES PATENT AND TRADEMARK OFFICE
CERTIFICATE OF CORRECTION

PATENT NO. : 5,159,341

DATED : October 27, 1992

INVENTOR(S) : Damien McCartney; David R. Welland

It is certified that error appears in the above-identified patent and that said Letters Patent is hereby corrected as shown below:

Col. 9, Line 39 - delete "at a first rate".
Col. 9, Line 39 - before "produce" insert --alternately--.
Col. 9, Line 40 - delete "for".
Col. 9, Line 41 - delete "for".
Col. 9, Line 42 - change "a" to --the--.
Col. 9, Lines 42-43 - delete "alternately producing analog input charge packets".
Col. 9, Line 54 - change "a second" to --the first--.
Col. 9, Lines 54-55 - delete "which is approximately one half of the first rate, said output".
Col. 9, Line 60 - delete "at the second rate".
Col. 10, Line 34 - change "voltage at a" to --voltage at the--.
Col. 10, Line 40 - delete "and".
Col. 10, Lines 44-45 - delete "at a second rate that is approximately one half the first rate".
Col. 10, Line 49 - after "f)" insert --operating the quantizer at the first rate and --.
Col. 10, Lines 49-50 - delete "at the second rate".
Col. 10, Lines 51-52 - change "combined analog input samples and reference samples" to --analog input voltage--.
Col. 11, Line 30 - delete "at a first rate".
Col. 11, Line 34 - after "first means" insert -- at a first sampling rate --.
Col. 11, Line 34 - change "which is" to --said first means being--.
Col. 11, Line 37 - change "the predetermined" to --a predetermined--.
Col. 11, Line 38 - after "means" insert --at the first sampling rate--.
Col. 11, Line 38 - change "which is" to --said second means being--.
Col. 11, Line 41 - delete "and".
Col. 11, Line 44 - delete "and".

UNITED STATES PATENT AND TRADEMARK OFFICE
CERTIFICATE OF CORRECTION

PATENT NO. : 5,159,341
DATED : October 27, 1992
INVENTOR(S) : Damien McCartney, et al.

It is certified that error appears in the above-identified that said Letters Patent is hereby corrected as shown below:

Column 12, lines 5-7 change "the combined analog input samples in reference samples" to read --the analog input voltage--.

Signed and Sealed this

Ninth Day of August, 1994

Attest:

BRUCE LEHMAN

*Attesting Officer*    *Commissioner of Patents and Trademarks*